(12) United States Patent
Brobston

(10) Patent No.: US 7,983,327 B2  
(45) Date of Patent: Jul. 19, 2011

(54) METHOD AND SYSTEM FOR PROVIDING DIGITAL ADAPTIVE PREDISTORTION IN A SUBSCRIBER STATION

(75) Inventor: Michael L. Brobston, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 827 days.

(21) Appl. No.: 11/510,899

(22) Filed: Aug. 28, 2006

(65) Prior Publication Data

US 2008/0049868 A1 Feb. 28, 2008

(51) Int. Cl.
- *H04B 1/38* (2006.01)
- *H04B 1/04* (2006.01)
- *H04L 25/03* (2006.01)

(52) U.S. Cl. ............ 375/219; 375/297; 455/114.3

(58) Field of Classification Search .......... 375/297, 375/219, 296; 455/69, 114.3, 126  
See application file for complete search history.

(56) References Cited

U.S. PATENT DOCUMENTS

| 5,740,520 | A * | 4/1998 | Cyze et al. ............... 455/114.3 |
| 7,529,524 | B1 * | 5/2009 | Giallorenzi et al. ......... 375/297 |
| 2002/0018531 | A1 * | 2/2002 | Ratto ........................ 375/297 |
| 2004/0151257 | A1 * | 8/2004 | Staszewski et al. ........ 375/297 |
| 2005/0129140 | A1 * | 6/2005 | Robinson ................... 375/297 |
| 2006/0050810 | A1 * | 3/2006 | Haque et al. ............... 375/297 |
| 2006/0078065 | A1 * | 4/2006 | Cai et al. ................... 375/297 |

* cited by examiner

Primary Examiner — Betsy L Deppe

(57) ABSTRACT

A method for providing digital adaptive predistortion in a subscriber station is provided that includes applying predistortion, based on a set of predistortion characteristics, to a transmit signal to generate a predistorted signal. An amplifier input signal is generated based on the predistorted signal. The amplifier input signal is amplified to generate an amplified signal. The amplified signal is sampled to generate a sampled signal. The sampled signal is processed through a receive channel of the subscriber station to generate a processed signal. A determination is made regarding whether to adjust the set of predistortion characteristics based on the processed signal.

28 Claims, 6 Drawing Sheets

US 7,983,327 B2

METHOD AND SYSTEM FOR PROVIDING DIGITAL ADAPTIVE PREDISTORTION IN A SUBSCRIBER STATION

TECHNICAL FIELD OF THE INVENTION

The present application relates generally to subscriber stations in wireless communication networks and, more specifically, to a method and system for providing digital adaptive predistortion in a subscriber station.

BACKGROUND OF THE INVENTION

In many emerging wireless standards that support broadband data, Orthogonal Frequency Division Multiplexing (OFDM) modulation is commonly used with high order modulation formats, such as 16-QAM or 64-QAM. This modulation format is used due to its high spectral efficiency and tolerance to channel fading. To support these high order modulation formats, the channel should have relatively high fidelity, with an error vector magnitude (EVM) around 2% or lower. Because of this, severe constraints are placed on the linearity of the power amplifiers both at the network base stations or access points and at the customer terminals, or subscriber stations.

To overcome this problem, a conventional approach involves backing off the average output power of the power amplifier a significant margin from its compression point. However, as the back-off increases, the efficiency of the power amplifier decreases, resulting in a reduction in terminal battery life.

In addition, for OFDM waveforms, the peak-to-average power ratio (PAPR) is relatively high such that even further back-off is needed. Thus, the EVM requirements coupled with the high PAPR characteristics of OFDM waveforms result in a power amplifier with very low efficiency both at the terminal and at the base station or access point. As a result, battery drain is increased and power amplifier thermal dissipation uses more die area and increases cost. Therefore, there is a need in the art for a method of improving the efficiency of the power amplifier, especially when using OFDM waveforms, while maintaining or improving the waveform EVM and adjacent channel power ratio.

SUMMARY OF THE INVENTION

A method for providing digital adaptive predistortion in a subscriber station is provided. According to an advantageous embodiment of the present disclosure, the method includes applying predistortion, based on a set of predistortion characteristics, to a transmit signal to generate a predistorted signal. An amplifier input signal is generated based on the predistorted signal. The amplifier input signal is amplified to generate an amplified signal. The amplified signal is sampled to generate a sampled signal. The sampled signal is processed through a receive channel of the subscriber station to generate a processed signal. A determination is made regarding whether to adjust the set of predistortion characteristics based on the processed signal.

According to another embodiment of the present disclosure, a radio frequency (RF) transceiver capable of providing digital adaptive predistortion in a subscriber station is provided that includes a transmit channel and a receive channel. The transmit channel is operable to process a transmit signal to generate an amplifier input signal for a power amplifier. The transmit channel has a digital adaptive predistortion block that is operable to apply predistortion to the transmit signal based on a set of predistortion characteristics. The power amplifier is operable to generate an amplified signal based on the amplifier input signal. The receive channel is operable to process a sampled signal, which is generated based on the amplified signal, to generate a processed signal. The digital adaptive predistortion block is also operable to determine whether to adjust the set of predistortion characteristics based on the processed signal.

According to yet another embodiment of the present disclosure, a system for providing digital adaptive predistortion in a subscriber station is provided that includes a power amplifier, a sampling system, and a radio frequency integrated circuit (RFIC). The power amplifier is operable to amplify an amplifier input signal to generate an amplified signal. The sampling system is operable to sample the amplified signal to generate a sampled signal. The RFIC has a transmit channel and a receive channel. The transmit channel is operable to apply predistortion to a transmit signal to generate a predistorted signal. The amplifier input signal is generated based on the predistorted signal. The receive channel is operable to process the sampled signal to generate a processed signal. The transmit channel is also operable to apply predistortion to a subsequent transmit signal based on the processed signal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or" is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged transceiver.

Figure 1:
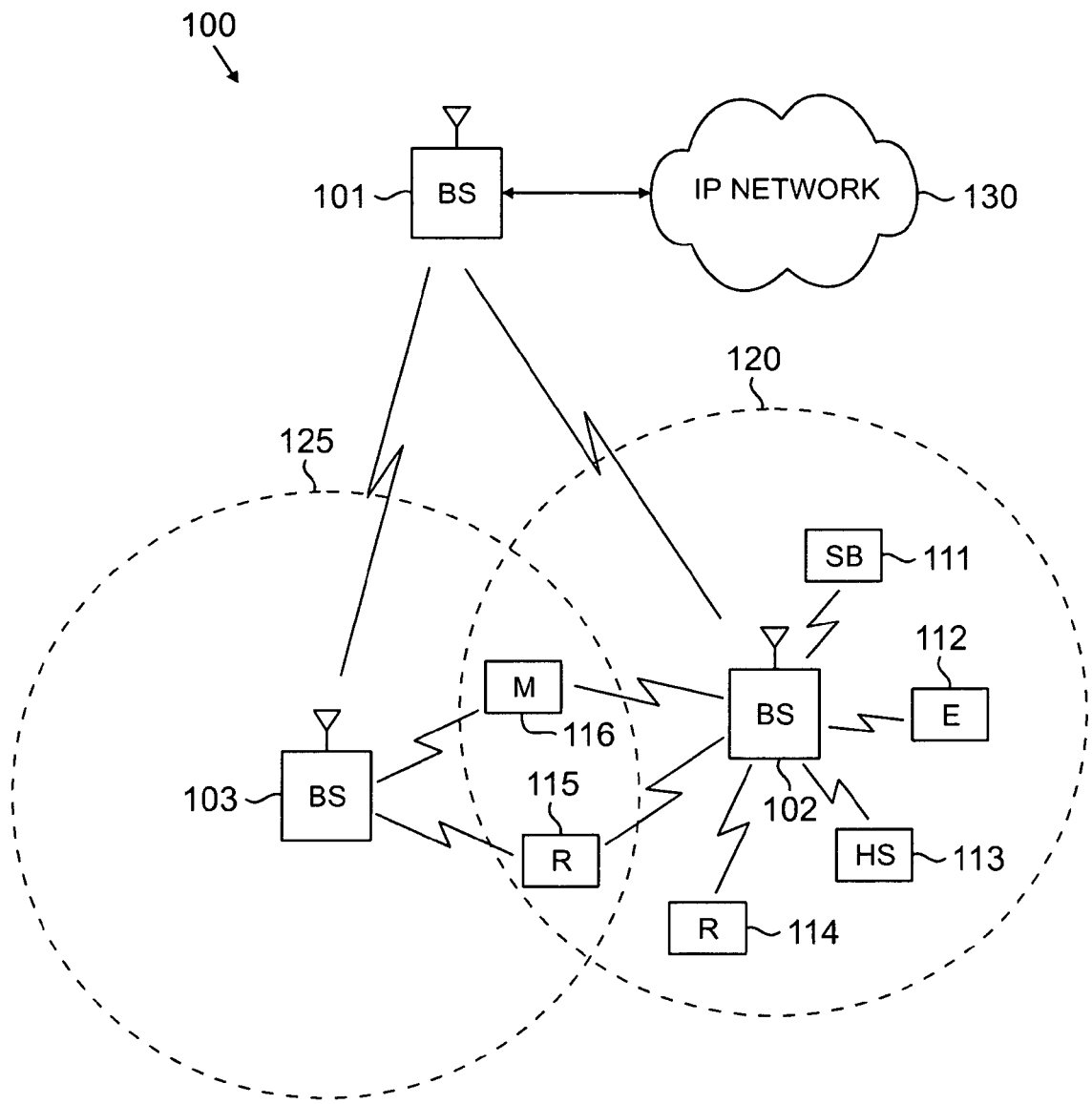
FIG. 1 illustrates a wireless network operable to provide digital adaptive predistortion in subscriber stations according to one embodiment of the disclosure.

FIG. 1 illustrates a wireless network 100 that is operable to provide digital adaptive predistortion in subscriber stations according to one embodiment of the present disclosure. In the illustrated embodiment, wireless network 100 includes base station (BS) 101, base station (BS) 102, and base station (BS) 103. Base station 101 communicates with base station 102 and base station 103. Base station 101 also communicates with Internet protocol (IP) network 130, such as the Internet, a proprietary IP network, or other data network.

Base station 102 provides wireless broadband access to network 130, via base station 101, to a first plurality of subscriber stations within coverage area 120 of base station 102. The first plurality of subscriber stations includes subscriber station (SS) 111, subscriber station (SS) 112, subscriber station (SS) 113, subscriber station (SS) 114, subscriber station (SS) 115 and subscriber station (SS) 116. In an exemplary embodiment, SS 111 may be located in a small business (SB), SS 112 may be located in an enterprise (E), SS 113 may be located in a WiFi hotspot (HS), SS 114 may be located in a first residence, SS 115 may be located in a second residence, and SS 116 may be a mobile (M) device.

Base station 103 provides wireless broadband access to network 130, via base station 101, to a second plurality of subscriber stations within coverage area 125 of base station 103. The second plurality of subscriber stations includes subscriber station 115 and subscriber station 116. In alternate embodiments, base stations 102 and 103 may be connected directly to the Internet by means of a wired broadband connection, such as an optical fiber, DSL, cable or T1/E1 line, rather than indirectly through base station 101.

In other embodiments, base station 101 may be in communication with either fewer or more base stations. Furthermore, while only six subscriber stations are shown in FIG. 1, it is understood that wireless network 100 may provide wireless broadband access to more than six subscriber stations. It is noted that subscriber station 115 and subscriber station 116 are on the edge of both coverage area 120 and coverage area 125. Subscriber station 115 and subscriber station 116 each communicate with both base station 102 and base station 103 and may be said to be operating in handoff mode, as known to those of skill in the art.

In an exemplary embodiment, base stations 101-103 may communicate with each other and with subscriber stations 111-116 using an IEEE-802.16 wireless metropolitan area network standard, such as, for example, an IEEE-802.16e standard. In another embodiment, however, a different wireless protocol may be employed, such as, for example, a HIPERMAN wireless metropolitan area network standard. Base station 101 may communicate through direct line-of-sight or non-line-of-sight with base station 102 and base station 103, depending on the technology used for the wireless backhaul.

Base station 102 and base station 103 may each communicate through non-line-of-sight with subscriber stations 111-116 using OFDM and/or OFDMA techniques.

Base station 102 may provide a T1 level service to subscriber station 112 associated with the enterprise and a fractional T1 level service to subscriber station 111 associated with the small business. Base station 102 may provide wireless backhaul for subscriber station 113 associated with the WiFi hotspot, which may be located in an airport, café, hotel, or college campus. Base station 102 may provide digital subscriber line (DSL) level service to subscriber stations 114, 115 and 116.

Subscriber stations 111-116 may use the broadband access to network 130 to access voice, data, video, video teleconferencing, and/or other broadband services. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer, a laptop computer, a gateway, or another device.

Dotted lines show the approximate extents of coverage areas 120 and 125, which are shown as approximately circular for the purposes of illustration and explanation only. It should be clearly understood that the coverage areas associated with base stations, for example, coverage areas 120 and 125, may have other shapes, including irregular shapes, depending upon the configuration of the base stations and variations in the radio environment associated with natural and man-made obstructions.

Also, the coverage areas associated with base stations are not constant over time and may be dynamic (expanding or contracting or changing shape) based on changing transmission power levels of the base station and/or the subscriber stations, weather conditions, and other factors. In an embodiment, the radius of the coverage areas of the base stations, for example, coverage areas 120 and 125 of base stations 102 and 103, may extend in the range from less than 2 kilometers to about fifty kilometers from the base stations.

As is well known in the art, a base station, such as base station 101, 102, or 103, may employ directional antennas to support a plurality of sectors within the coverage area. In FIG. 1, base stations 102 and 103 are depicted approximately in the center of coverage areas 120 and 125, respectively. In other embodiments, the use of directional antennas may locate the base station near the edge of the coverage area, for example, at the point of a cone-shaped or pear-shaped coverage area.

The connection to network 130 from base station 101 may comprise a broadband connection, for example, a fiber optic line, to servers located in a central office or another operating company point-of-presence. The servers may provide communication to an Internet gateway for internet protocol-based communications and to a public switched telephone network gateway for voice-based communications. In the case of voice-based communications in the form of voice-over-IP (VoIP), the traffic may be forwarded directly to the Internet gateway instead of the PSTN gateway. The servers, Internet gateway, and public switched telephone network gateway are not shown in FIG. 1. In another embodiment, the connection to network 130 may be provided by different network nodes and equipment.

The carrier modulation formats used in wireless networks is often a complex modulation in order to achieve high spectral efficiency. The waveforms of such complex modulation formats, such as OFDM, CDMA, WCDMA, 16/64/256

QAM, and others, typically have high peak-to-average-power-ratio (PAPR). To support these complex waveforms, the wireless link provides very low distortion or Error Vector Magnitude (EVM). The EVM requirements coupled with the high PAPR characteristics of these waveforms typically result in a power amplifier with very low efficiency both at the subscriber station 111-116 and at the base station 101-103. As a result, battery drain is increased and power amplifier thermal dissipation uses more die area and increases cost. Therefore, many systems implement some type of solution for improving the efficiency of the power amplifier.

The more effective of these solutions include digital predistortion solutions that are adaptive and have memory correction. These are often implemented in large Field-Programmable Gate Arrays (FPGAs) or separate Application-Specific Integrated Circuits (ASICs) working in conjunction with Digital Signal Processors (DSPs). Thus, these solutions are not practical for a terminal application due to the expense and power dissipation associated with the large devices in which they are implemented.

Many conventional subscriber stations rely on the use of highly-integrated radio frequency integrated circuits (RFICs) to reduce cost and power consumption. While digital predistortion would be a beneficial feature for a subscriber station in an OFDM network, using ASICs and DSPs as separate devices is not a practical solution. Thus, in accordance with an embodiment of this disclosure, any one or more of the subscriber stations 111-116 may comprise an RFIC with a digital predistortion core that is integrated into the digital baseband processing block of the RFIC. Alternatively, the digital predistortion core may be integrated into an ASIC. By integrating the digital predistortion block into the RFIC or the ASIC, the cost and power dissipation is reduced such that implementation of this function in the subscriber stations 111-116 becomes practical.

Figure 2:
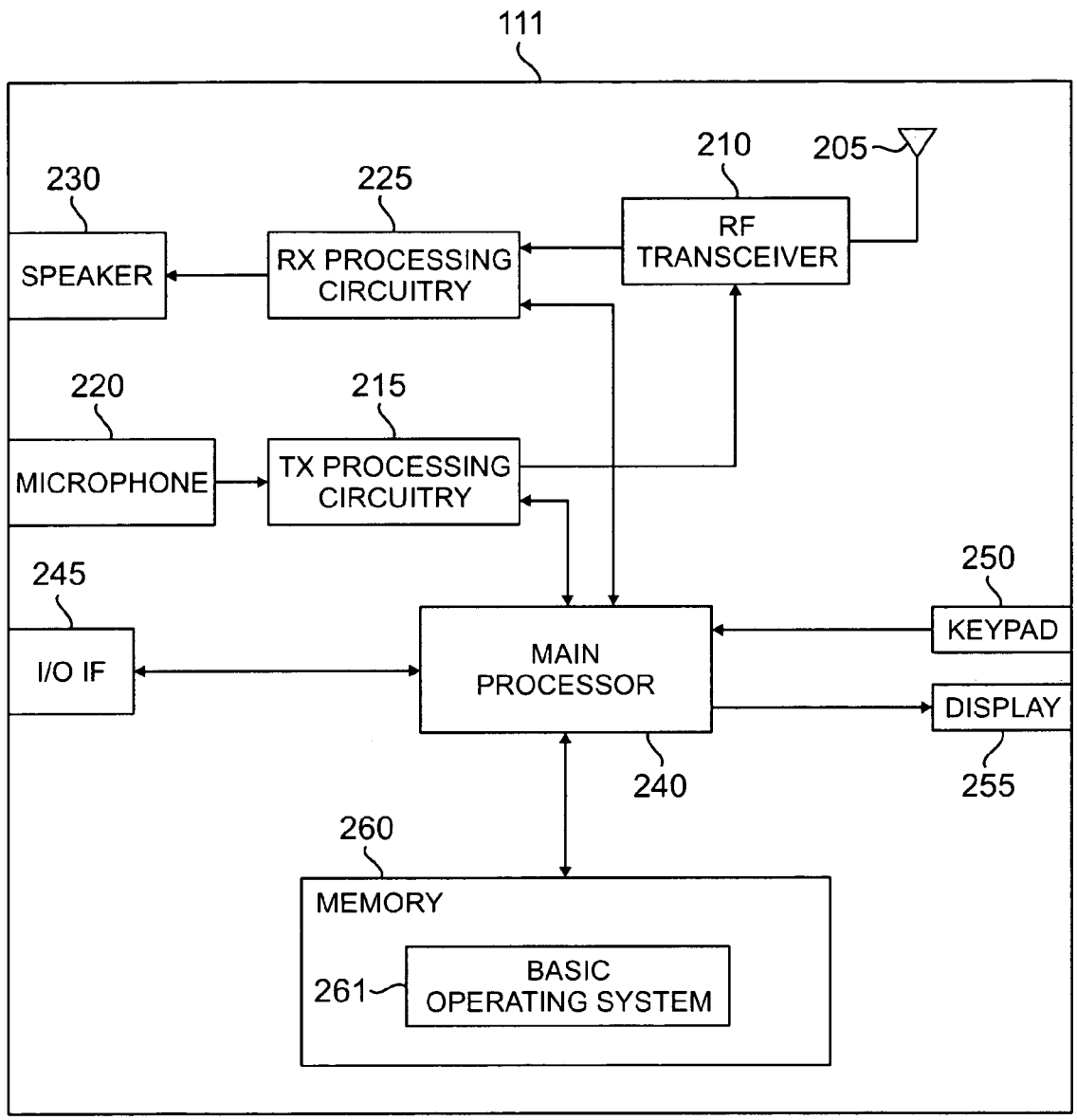
FIG. 2 illustrates a subscriber station operable to provide digital adaptive predistortion according to one embodiment of the disclosure.

FIG. 2 illustrates a wireless subscriber station 111 according to an advantageous embodiment of the present disclosure. Wireless subscriber station 111 comprises antenna 205, radio frequency (RF) transceiver 210, transmitter (TX) processing circuitry 215, microphone 220, and receiver (RX) processing circuitry 225. MS 111 also comprises speaker 230, main processor 240, input/output (I/O) interface 245, keypad 250, display 255, and memory 260. Memory 260 further comprises basic operating system (OS) program 261.

RF transceiver 210 receives from antenna 205 an incoming RF signal transmitted by a base station of wireless network 100. RF transceiver 210 down-converts the incoming RF signal to produce an intermediate frequency (IF) or a baseband signal. The IF or baseband signal is sent to receiver processing circuitry 225, which produces a processed baseband signal by filtering, digitizing the baseband or IF signal, additional filtering, if necessary, demodulation and/or decoding. Receiver processing circuitry 225 transmits the processed baseband signal to speaker 230 (i.e., voice data) or to main processor 240 for further processing (e.g., web browsing).

Transmitter processing circuitry 215 receives analog or digital voice data from microphone 220 or other outgoing baseband data (e.g., web data, e-mail, interactive video game data) from main processor 240. Transmitter processing circuitry 215 encodes, modulates, multiplexes, and/or digitizes the outgoing baseband data to produce a processed baseband or IF signal. RF transceiver 210 receives the outgoing processed baseband or IF signal from transmitter processing circuitry 215. RF transceiver 210 up-converts the baseband or IF signal to an RF signal that is transmitted via antenna 205.

As described in more detail below in connection with FIGS. 3A-B and 5, RF transceiver 210 is operable to provide digital adaptive predistortion for the subscriber station 111 by integrating a digital adaptive predistortion block into the baseband processing of an RFIC or an ASIC. This results in a cost-effective and power efficient implementation of a digital predistortion function, which allows a power amplifier for the subscriber station 111 to operate in a linear region with more efficiency. For a particular embodiment, during a transmit burst, the power amplifier output is sampled and provided back to the predistortion block through a receive channel of the RFIC, eliminating any need for a separate sampling channel.

In an advantageous embodiment of the present disclosure, main processor 240 is a microprocessor or microcontroller. Memory 260 is coupled to main processor 240. According to an advantageous embodiment of the present disclosure, part of memory 260 comprises a random access memory (RAM) and another part of memory 260 comprises a non-volatile memory, such as Flash memory, which acts as a read-only memory (ROM).

Main processor 240 executes basic operating system program 261 stored in memory 260 in order to control the overall operation of wireless subscriber station 111. In one such operation, main processor 240 controls the reception of forward channel signals and the transmission of reverse channel signals by RF transceiver 210, receiver processing circuitry 225, and transmitter processing circuitry 215, in accordance with well-known principles.

Main processor 240 is capable of executing other processes and programs resident in memory 260. Main processor 240 can move data into or out of memory 260, as required by an executing process. Main processor 240 is also coupled to I/O interface 245. I/O interface 245 provides subscriber station 111 with the ability to connect to other devices such as laptop computers and handheld computers. I/O interface 245 is the communication path between these accessories and main controller 240.

Main processor 240 is also coupled to keypad 250 and display unit 255. The operator of subscriber station 111 uses keypad 250 to enter data into subscriber station 111. Display 255 may be a liquid crystal display capable of rendering text and/or at least limited graphics from web sites. Alternate embodiments may use other types of displays.

Figure 3A:
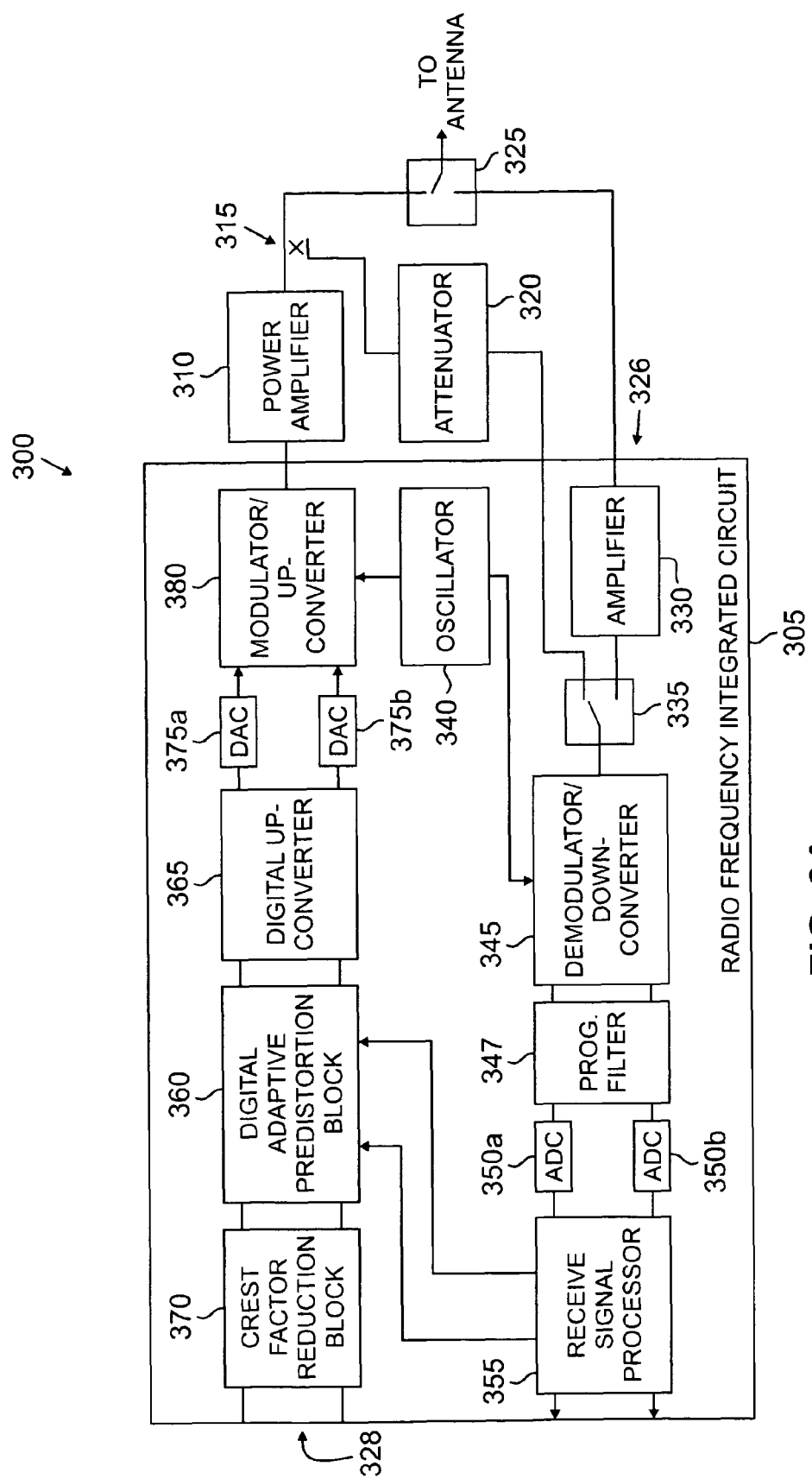
FIGS. 3A-B illustrate details of a portion of the transceiver of FIG. 2 according to alternate embodiments of the disclosure.
Figure 3B:
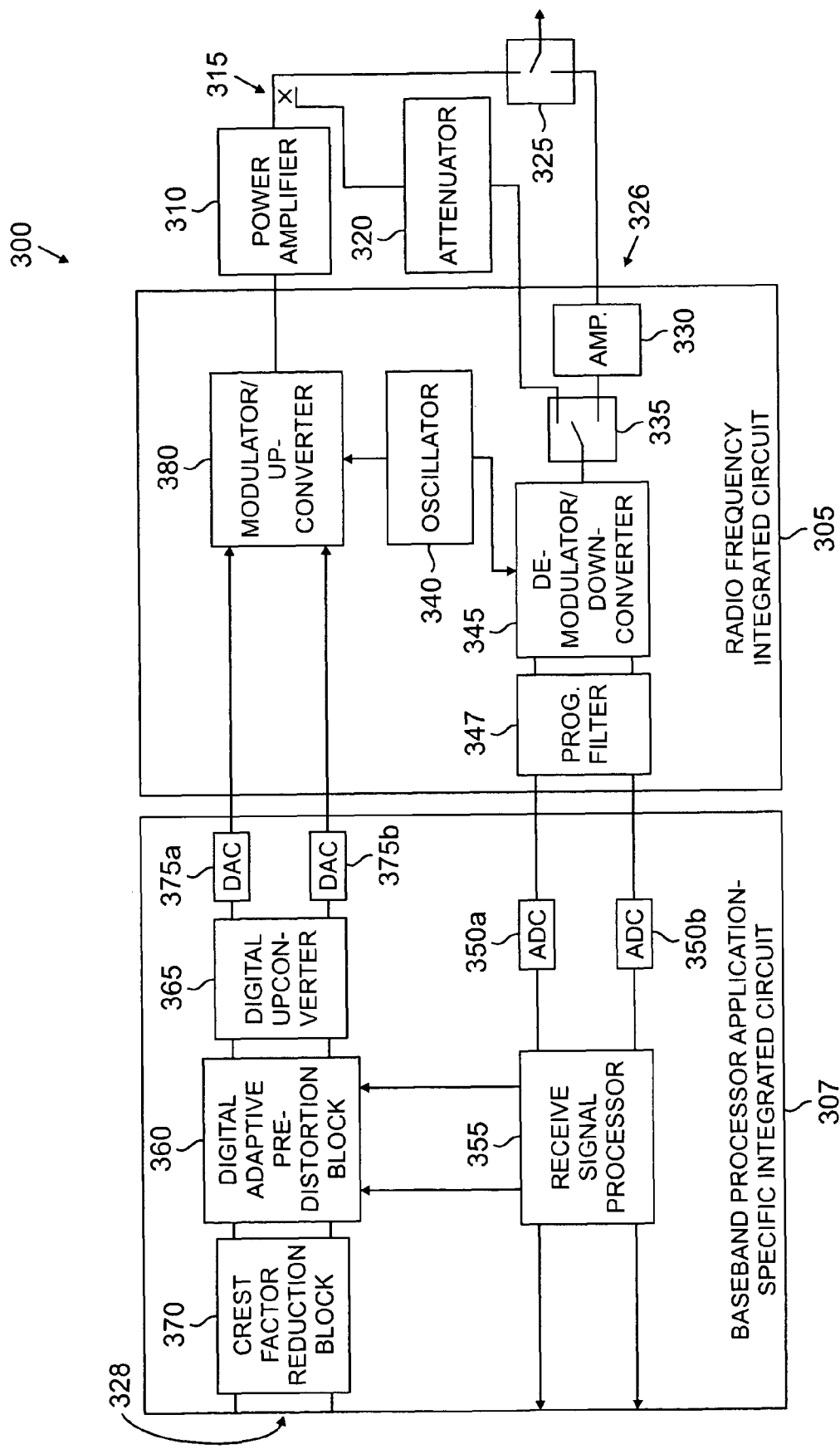

FIGS. 3A-B illustrate a portion of a radio frequency (RF) transceiver 300, such as RF transceiver 210 of FIG. 2, that is operable to provide digital adaptive predistortion in a subscriber station 111 according to alternate embodiments of the disclosure. For the embodiment illustrated in FIG. 3A, RF transceiver 300 comprises a radio frequency integrated circuit (RFIC) 305, a power amplifier 310, a coupler 315 and an optional attenuator 320 (or other suitable sampling components), and a switch 325. RFIC 305 provides a receive channel 326 for receiving data at the subscriber station 111 and a transmit channel 328 for transmitting data from the subscriber station 111. Also, although the illustrated embodiment shows power amplifier 310 as external to RFIC 305, it will be understood that RFIC 305 may comprise power amplifier 310 as an integrated component.

RFIC 305 comprises an amplifier 330, a switch 335, an oscillator 340, a demodulator/downconverter 345, an optional programmable filter 347, two analog-to-digital converters (ADCS) 350*a-b*, a receive signal processor 355, a digital adaptive predistortion block 360, an optional digital upconverter 365, an optional crest factor reduction block 370, two digital-to-analog converters (DACs) 375*a-b*, and a modulator/upconverter 380.

Power amplifier 310 is operable to amplify signals to be transmitted from subscriber station 111. Generally, the more power used by power amplifier 310 in transmitting, the less linear its performance becomes. Thus, to preserve waveform accuracy, the amount of power used by power amplifier 310 in transmitting may be limited. However, when power amplifier 310 uses more power to transmit, efficiency is increased. Because of this, power amplifiers in typical subscriber stations operate with much less efficiency than may be desired in order to preserve linearity.

Thus, digital adaptive predistortion block 360 of RF transceiver 300 is operable to apply an inverse transfer function to the signals being transmitted in order to compensate for the non-linearity introduced at higher power levels by power amplifier 310, allowing power amplifier 310 to operate at a more efficient power level without sacrificing linearity. In accordance with the present disclosure, digital adaptive predistortion block 360 has reduced power and resource requirements as compared to a conventional digital adaptive predistortion block, such as might be implemented in a base station 101-103, for example.

In addition, for one embodiment, digital adaptive predistortion block 360 is operable to use the receive channel 326 as a sampling, or observation, channel and to function on the same bandwidth in the receive channel 326 (the sampling channel) as in the transmit channel 328. For an alternative embodiment, the receive channel 326 comprises the optional programmable filter 347, which may be positioned in any suitable location within the receive channel 326.

Figure 4:
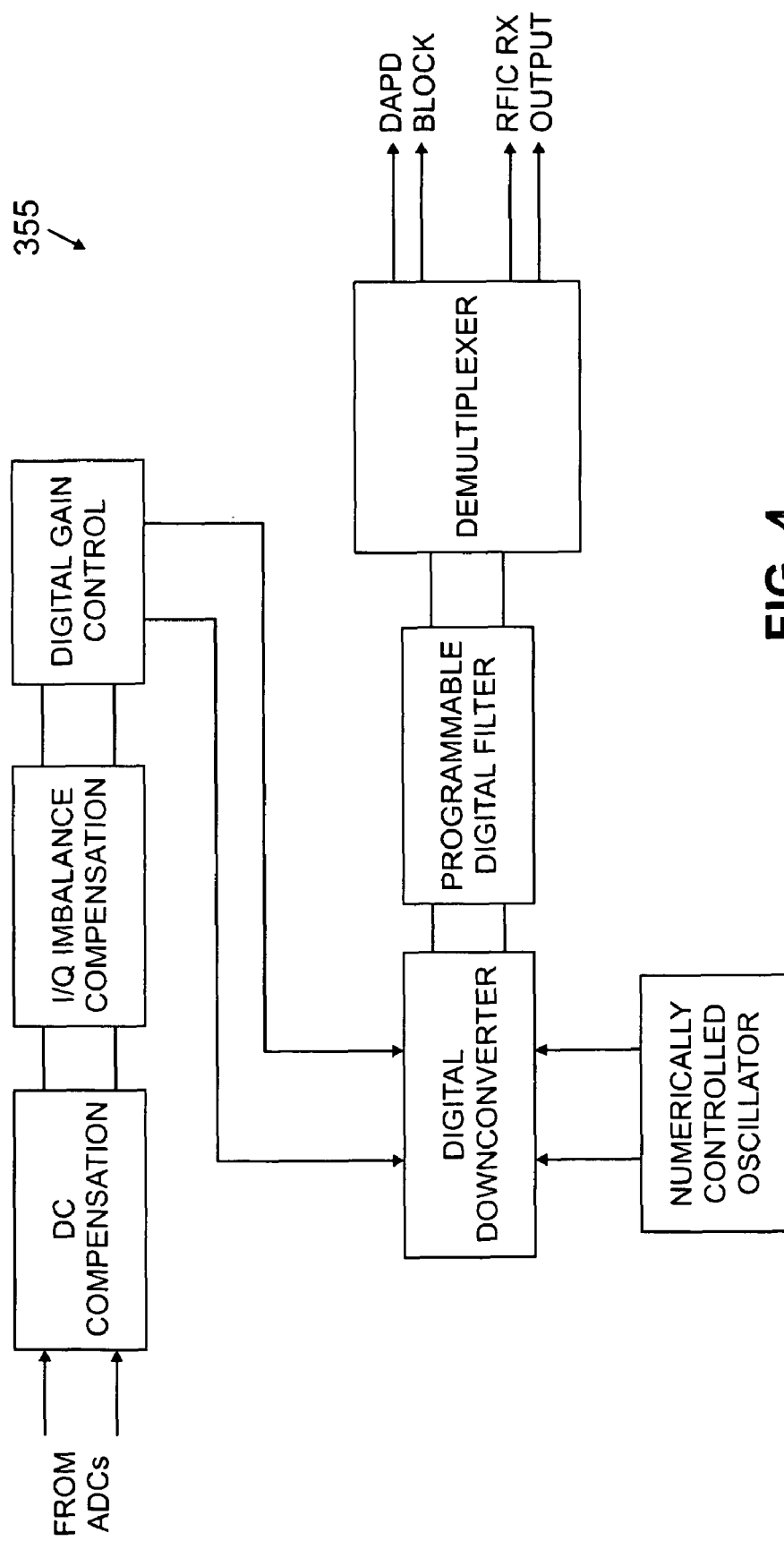
FIG. 4 illustrates details of the receive signal processor of FIG. 3A or 3B according to one embodiment of the disclosure.

The programmable filter 347 may comprise a programmable analog filter, a programmable digital filter, or a combination of these. For example, for one embodiment, the programmable filter 347 may comprise an analog filter positioned between the demodulator/downconverter 345 and the ADCs 350a-b, as illustrated in FIGS. 3A-B. For another embodiment, the programmable filter 347 may comprise a digital filter integrated into receive signal processor 355, as illustrated in FIG. 4. For yet another embodiment, the programmable filter 347 may comprise an analog filter positioned between the demodulator/downconverter 345 and the ADCs 350a-b along with a digital filter integrated into receive signal processor 355.

Using the programmable filter 347, the receive channel 326 may be operated with a variable bandwidth provided by the programmable filter 347. In this way, the receive channel 326 may provide wideband reception during the transmit carrier sampling period and provide narrow channel filtering during the receive burst period. Wideband reception may be used in the receive path 326 during the transmit carrier sampling period in order to provide all of the downconverted intermodulation spectral content generated by power amplifier 310 to digital adaptive predistortion block 360.

Crest factor reduction block 370 is operable to reduce high crest factors in a controlled manner. High-order modulations that support high data rates over the air generally have a high crest factor, which is the peak power of the waveform relative to the average power. The instantaneous power may vary by 20 to 30 times, for example. Because of this, if power amplifier 310 is to be operated in the linear region at peak power, the output power is reduced. As a result, the efficiency of power amplifier 310 is also reduced.

Power amplifier 310 may be operated at higher power levels to improve efficiency, but this results in uncontrolled clipped peaks and distortion. Thus, using crest factor reduction block 370 allows the peaks to be reduced in a controlled manner. This allows power amplifier 310 to operate at a higher power level with less back-off from a compression point, which increases efficiency.

In operation, for an embodiment in which RF transceiver 300 operates in a time division duplexing (TDD) mode, RFIC 305 may receive data during a receive time slot and then transmit data during a following transmit time slot. For one such embodiment, RF transceiver 300 receives a signal from an antenna (not shown in FIG. 3A) at switch 325. Switch 325 may provide the received signal to amplifier 330, which amplifies the signal and provides the signal to switch 335. Amplifier 330 may comprise a low noise amplifier.

Switch 335 provides the signal to demodulator/downconverter 345, which demodulates and downconverts the signal based on a signal received from oscillator 340. Demodulator/downconverter 345 may be configured based on the type of receiver architecture, such as heterodyne, zero-IF, or near zero-IF. Demodulator/downconverter 345 may provide the signal to optional programmable filter 347, which provides the filtered signal to ADCs 350a-b, which each convert the signal from an analog signal into a digital signal. For example, ADC 350a may convert an "I" signal, while ADC 350b converts a "Q" signal.

The signal is then provided to receive signal processor 355, which further processes the signal and provides the results to a baseband controller (not shown in FIG. 3A) and/or to digital adaptive predistortion block 360 (depending on whether RF transceiver 300 is within a transmit time slot or a receive time slot). For example, receive signal processor 355 may be operable to perform filtering, decimation, DC compensation, I/Q imbalance compensation, equalization, digital downconversion, automatic gain control, sample rate conversion and/or other suitable functions. During a transmit time slot, RF transceiver 300 provides a transmit signal for transmission over the antenna from the baseband controller to crest factor reduction block 370. Crest factor reduction block 370 applies crest factor reduction to the signal and provides the signal to digital adaptive predistortion block 360, which applies digital adaptive predistortion to the signal based on a set of predistortion characteristics. The signal is then provided to digital upconverter 365, which upconverts the signal and provides the signal to the DACs 375a-b.

Each DAC 375a-b converts the signal from a digital signal into an analog signal. For example, DAC 375a may convert an "I" signal, while DAC 375b converts a "Q" signal. The signal is then provided to modulator/upconverter 380, which modulates and upconverts the signal based on a signal received from oscillator 340. The signal is then provided to power amplifier 310, which amplifies the signal and provides the signal to switch 325 for transmission over the antenna.

Also during the transmit time slot, coupler 315 and optional attenuator 320 sample the signal being generated by power amplifier 310 for transmission over the antenna. Coupler 315 may provide a "copy" of the amplified signal to attenuator 320, which attenuates the signal and provides the attenuated signal to switch 335. Switch 335 provides the attenuated signal to demodulator/downconverter 345, which demodulates and downconverts the attenuated signal based on a signal received from oscillator 340. Demodulator/downconverter 345 may then provide the signal to optional programmable filter 347. ADCs 350a-b then each convert the signal from an analog signal into a digital signal. The signal is then provided to receive signal processor 355, which further processes the signal and provides the results to digital adaptive predistortion block 360.

Digital adaptive predistortion block 360 may then compare the processed signal received from receive signal processor 355 to the transmit signal originally received from the baseband controller for transmission over the antenna, which may have been crest factor reduced by optional crest factor reduction block 370. If these signals are equal, the predistortion applied earlier was appropriate and no adjustments are made to the set of predistortion characteristics. However, if these signals are unequal, digital adaptive predistortion block 360 may adjust the set of predistortion characteristics for use in a subsequent transmit time slot.

Thus, in this way, a portion of the receive channel 326 may be used during the transmit time slot in order to process samples of the signal being generated by power amplifier 310 for transmission over the antenna. Based on the signal provided to digital adaptive predistortion block 360 by receive signal processor 355, digital adaptive predistortion block 360 may make adjustments, if desired, to the digital adaptive predistortion applied to the next signal to be transmitted by RF transceiver 300.

For the embodiment illustrated in FIG. 3B, RF transceiver 300 operates as described above in connection with FIG. 3A. However, for this embodiment modulator/upconverter 380 of the transmit channel 328 and local oscillator 340 are located in RFIC 305. In addition, low noise amplifier 330, switch 335, demodulator/downconverter 345 and programmable filter 347 of the receive channel 326 are located in RFIC 305. Crest factor reduction block 370, digital adaptive predistortion block 360, digital upconverter 365, and DACs of the transmit channel 328 and receive signal processor 355 and ADCs 350 of the receive channel 326 are located in the baseband processor ASIC 307.

FIG. 4 illustrates details of receive signal processor 355 according to one embodiment of the disclosure. As described above in connection with FIG. 3A, receive channel processor 355 may comprise an optional programmable digital filter as part of programmable filter 347. Thus, for the embodiment illustrated in FIG. 4, programmable filter 347 comprises either a digital filter integrated into receive signal processor 355 or a combination of a digital filter integrated into receive signal processor 355 and an analog filter in receive channel 326, such as between demodulator/downconverter 345 and ADCs 350a-b. It will be understood that FIG. 4 is one embodiment of receive signal processor 355 comprising a programmable digital filter and that other embodiments of receive signal processor 355 with or without a programmable digital filter may be implemented in RF transceiver 300.

Figure 5:
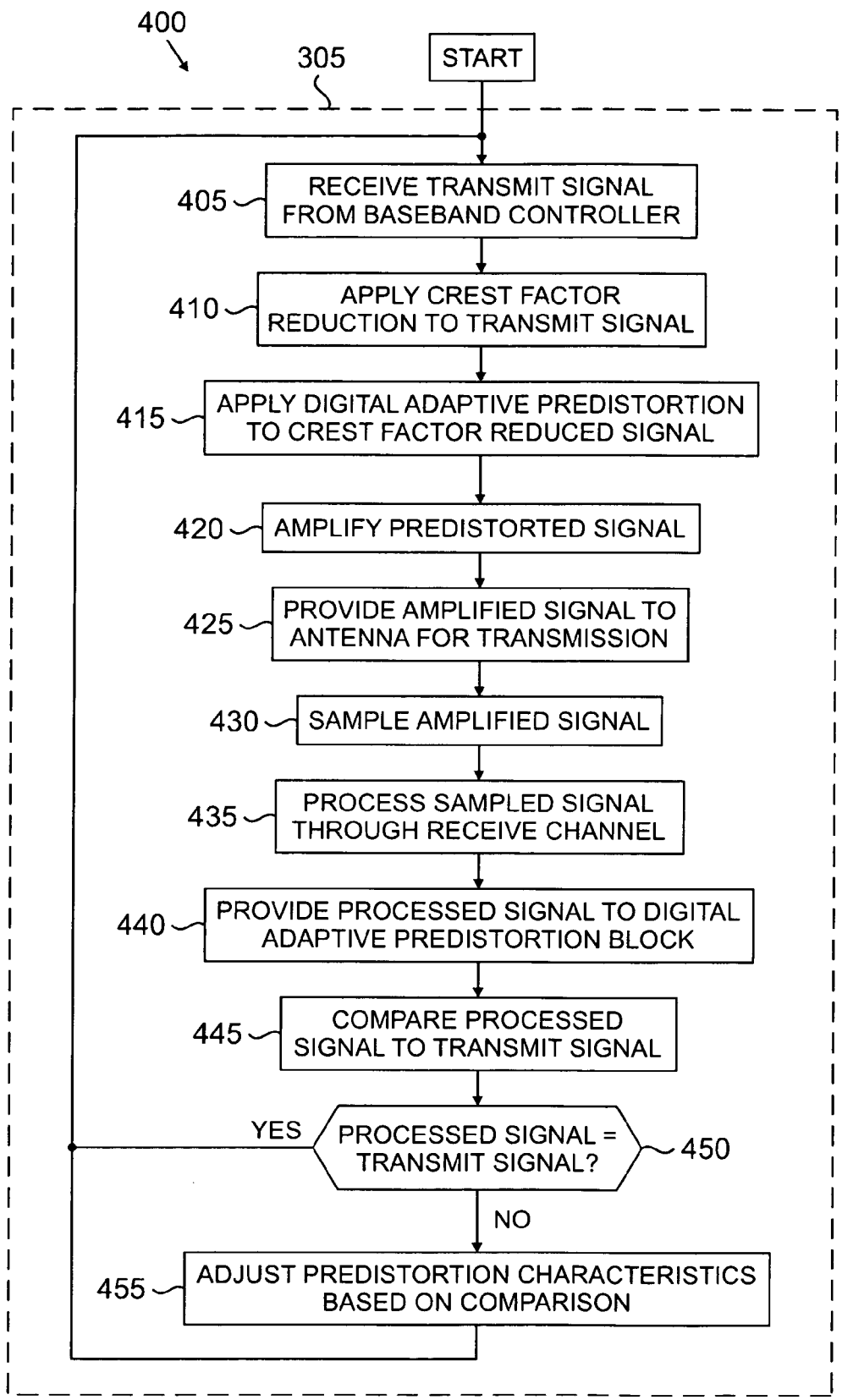
FIG. 5 is a flow diagram illustrating a method for providing digital adaptive predistortion in the transceiver of FIG. 3A or 3B according to one embodiment of the disclosure.

FIG. 5 is a flow diagram illustrating a method 400 for providing digital adaptive predistortion in RFIC 305 (and/or ASIC 307) of subscriber station 111 according to one embodiment of the disclosure. Initially, during a transmit time slot, transmit channel 328 receives a transmit signal from a baseband controller to be processed and transmitted from subscriber station 111 (process step 405).

For the embodiment in which crest factor reduction block 370 is implemented in RFIC 305 (or ASIC 307), crest factor reduction block 370 applies crest factor reduction to the transmit signal (process step 410). Digital adaptive predistortion block 360 applies digital adaptive predistortion to the crest factor reduced, transmit signal based on a set of predistortion characteristics (process step 415). For one embodiment, the predistorted signal is digitally upconverted by digital upconverter 365 after digital adaptive predistortion is applied.

Power amplifier 310 amplifies the predistorted signal (process step 420). For one embodiment, the predistorted signal is converted from a digital signal to an analog signal by DACs 375a-b and then modulated and upconverted by modulator/upconverter 380 based on a signal from oscillator 340 before being amplified by power amplifier 310. Switch 325 provides the amplified signal to the antenna for transmission from subscriber station 111 (process step 425).

Coupler 315 and attenuator 320, or other suitable sampling components, sample the amplified signal generated by power amplifier 310 (process step 430). RFIC 305 processes the sampled signal through receive channel 326, which may have a variable bandwidth determined based on an optional programmable filter 347 (process step 435). For one embodiment, switch 335 selects the sampled signal for processing in receive channel 326 instead of selecting a signal received at the antenna that may be provided by amplifier 330. For one embodiment, the processing performed by RFIC 305 includes demodulation and downconversion by demodulator/downconverter 345, conversion from an analog signal to a digital signal by ADCs 350a-b, and further processing by receive signal processor 355. Processing may also comprise programmable filtering.

Receive signal processor 355 provides the processed signal to digital adaptive predistortion block 360 (process step 440). Digital adaptive predistortion block 360 compares the processed signal received from receive signal processor 355 to the transmit signal previously received from the baseband controller, which may or may not have been crest factor reduced (process step 445).

If the processed signal is equal to the transmit signal (process step 450), digital adaptive predistortion block 360 applied appropriate predistortion to the transmit signal in step 410 and the method returns to step 405, where digital adaptive predistortion block 360 receives a subsequent transmit signal and, in step 410, applies predistortion again without making any adjustments to the set of predistortion characteristics.

However, if the processed signal is unequal to the transmit signal (process step 450), digital adaptive predistortion block 360 makes suitable adjustments to the set of predistortion characteristics used in applying predistortion to subsequent transmit signals based on the comparison of the processed signal and transmit signal (process step 455). The method then returns to step 405, where transmit channel 328 receives a subsequent transmit signal and, in step 415, after optional crest factor reduction, digital adaptive predistortion block 360 applies predistortion using the adaptively adjusted set of predistortion characteristics.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for providing digital adaptive predistortion in a subscriber station, comprising:
applying predistortion, based on a set of predistortion characteristics, to a transmit signal to generate a predistorted signal;
amplifying an amplifier input signal to generate an amplified signal, the amplifier input signal generated based on the predistorted signal;
sampling the amplified signal to generate a sampled signal;
processing the sampled signal through a receive channel of the subscriber station to generate a processed signal, wherein the receive channel is coupled to at least one antenna and configured to receive incoming signals via the antenna, and wherein the processing comprises filtering, using a programmable filter, the sampled signal on the same bandwidth on the receive channel as a transmit channel during a transmit period, and filtering, using the programmable filter, a receive signal on a varied bandwidth during a receive period; and determining whether to adjust the set of predistortion characteristics based on the processed signal.

2. The method as set forth in claim 1, further comprising processing the predistorted signal through the transmit channel of the subscriber station to generate the amplifier input signal.

3. The method as set forth in claim 2, wherein processing the predistorted signal through the transmit channel comprises:
applying crest factor reduction to the transmit signal to generate a crest factor reduced signal, the predistorted signal generated based on the crest factor reduced signal; and
digitally upconverting the predistorted signal to generate an upconverted signal, the upconverted signal comprising one of a baseband signal and an intermediate frequency (IF) signal, the amplifier input signal generated based on the upconverted signal.

4. The method as set forth in claim 3, wherein processing the predistorted signal through the transmit channel further comprises:
converting the upconverted signal from digital to analog to generate an analog transmit signal; and
modulating/upconverting the analog transmit signal to generate the amplifier input signal.

5. The method as set forth in claim 2, wherein processing the predistorted signal through the transmit channel comprises:
converting the predistorted signal from digital to analog to generate an analog transmit signal; and
modulating/upconverting the analog transmit signal to generate the amplifier input signal.

6. The method as set forth in claim 1, wherein determining whether to adjust the set of predistortion characteristics based on the processed signal comprises comparing the processed signal to the transmit signal.

7. The method as set forth in claim 6, further comprising adjusting the set of predistortion characteristics when the processed signal is unequal to the transmit signal.

8. A radio frequency (RF) transceiver capable of providing digital adaptive predistortion in a subscriber station, comprising:
a transmit channel configured to process a transmit signal to generate an amplifier input signal for a power amplifier, the transmit channel comprising a digital adaptive predistortion block configured to apply predistortion to the transmit signal based on a set of predistortion characteristics;
the power amplifier configured to generate an amplified signal based on the amplifier input signal; and
a receive channel coupled to at least one antenna and configured to receive incoming signals via the antenna and configured to process a sampled signal to generate a processed signal, the sampled signal generated based on the amplified signal,
wherein the receive channel comprises a programmable filter configured to process the sampled signal on the same bandwidth as the transmit channel during a transmit period and process a receive signal on a varied bandwidth during a receive period, and wherein the digital adaptive predistortion block is further configured to determine whether to adjust the set of predistortion characteristics based on the processed signal.

9. The RF transceiver as set forth in claim 8, the transmit channel further comprising a crest factor reduction block operable to apply crest factor reduction to the transmit signal to generate a crest factor reduced signal, the digital adaptive predistortion block operable to apply predistortion to the crest factor reduced signal in order to generate a predistorted signal, the transmit channel further comprising a digital upconverter operable to digitally upconvert the predistorted signal to generate an upconverted signal, the upconverted signal comprising one of a baseband signal and an intermediate frequency (IF) signal, the amplifier input signal generated based on the upconverted signal.

10. The RF transceiver as set forth in claim 9, the transmit channel further comprising at least one digital-to-analog converter operable to convert the upconverted signal from digital to analog to generate an analog transmit signal and a modulator/upconverter operable to modulate and upconvert the analog transmit signal to generate the amplifier input signal.

11. The RF transceiver as set forth in claim 8, the digital adaptive predistortion block operable to apply predistortion to the transmit signal in order to generate a predistorted signal, the transmit channel further comprising at least one digital-to-analog converter operable to convert the predistorted signal from digital to analog to generate an analog transmit signal and a modulator/upconverter operable to modulate and upconvert the analog transmit signal to generate the amplifier input signal.

12. The RF transceiver as set forth in claim 8, the digital adaptive predistortion block operable to determine whether to adjust the set of predistortion characteristics based on the processed signal by comparing the processed signal to the transmit signal.

13. The RF transceiver as set forth in claim 12, the digital adaptive predistortion block further operable to adjust the set of predistortion characteristics when the processed signal is unequal to the transmit signal.

14. The RF transceiver as set forth in claim 8, the receive channel comprising a switch operable to select as a receive channel input one of the sampled signal and a received signal, the received signal received at an antenna of the subscriber station, the receive channel operable to process the receive channel input selected by the switch.

15. The RF transceiver as set forth in claim 8, the transmit channel configured to process the transmit signal during a transmit time slot, the receive channel configured to process the sampled signal during the transmit time slot and to process a received signal during a receive time slot, the programmable filter configured to provide a first bandwidth for the receive channel during the transmit time slot and a second bandwidth for the receive channel during the receive time slot.

16. A system for providing digital adaptive predistortion in a subscriber station, comprising:
a power amplifier configured to amplify an amplifier input signal to generate an amplified signal;
a sampling system configured to sample the amplified signal to generate a sampled signal; and
a radio frequency integrated circuit (RFIC) comprising a transmit channel configured to apply predistortion to a transmit signal to generate a predistorted signal, the amplifier input signal generated based on the predistorted signal, and a receive channel configured to process the sampled signal to generate a processed signal, wherein the receive channel comprises a programmable filter configured to process the sampled signal on the same bandwidth as the transmit channel during a transmit period and process a receive signal on a varied bandwidth during a receive period, wherein the transmit channel is further configured to apply predistortion to a subsequent transmit signal based on the processed signal.

17. The system as set forth in claim 16, the transmit channel comprising a digital adaptive predistortion block operable to apply predistortion to the transmit signal based on a set of predistortion characteristics.

18. The system as set forth in claim 17, the digital adaptive predistortion block further operable to determine whether to adjust the set of predistortion characteristics based on the processed signal.

19. The system as set forth in claim 18, the digital adaptive predistortion block operable to determine whether to adjust the set of predistortion characteristics based on the processed signal by comparing the processed signal to the transmit signal.

20. The system as set forth in claim 19, the digital adaptive predistortion block further operable to adjust the set of predistortion characteristics when the processed signal is unequal to the transmit signal.

21. The system as set forth in claim 17, the transmit channel further comprising a crest factor reduction block operable to apply crest factor reduction to the transmit signal to generate a crest factor reduced signal, the digital adaptive predistortion block operable to apply predistortion to the crest factor reduced signal in order to generate a predistorted signal, the transmit channel further comprising a digital upconverter operable to digitally upconvert the predistorted signal to generate an upconverted signal, the upconverted signal comprising one of a baseband signal and an intermediate frequency (IF) signal, the amplifier input signal generated based on the upconverted signal.

22. The system as set forth in claim 21, the transmit channel further comprising at least one digital-to-analog converter operable to convert the upconverted signal from digital to analog to generate an analog transmit signal and a modulator/upconverter operable to modulate and upconvert the analog transmit signal to generate the amplifier input signal.

23. The system as set forth in claim 17, the transmit channel further comprising at least one digital-to-analog converter operable to convert the predistorted signal from digital to analog to generate an analog transmit signal and a modulator/upconverter operable to modulate and upconvert the analog transmit signal to generate the amplifier input signal.

24. The system as set forth in claim 16, the receive channel comprising a switch operable to select as a receive channel input one of the sampled signal and a received signal, the received signal received at an antenna of the subscriber station, the receive channel operable to process the receive channel input selected by the switch.

25. The system as set forth in claim 24, the sampling system comprising a coupler coupled to the power amplifier and an attenuator coupled to the coupler and to the switch.

26. The system as set forth in claim 16, the transmit channel configured to process the transmit signal during a transmit time slot, the receive channel configured to process the sampled signal during the transmit time slot and to process a received signal during a receive time slot, the programmable filter configured to provide a first bandwidth for the receive channel during the transmit time slot and a second bandwidth for the receive channel during the receive time slot.

27. A system for providing digital adaptive predistortion in a subscriber station, comprising:
a power amplifier configured to amplify an amplifier input signal to generate an amplified signal;
a sampling system configured to sample the amplified signal to generate a sampled signal; and
a baseband processor application-specific integrated circuit (ASIC) comprising a transmit channel configured to apply predistortion to a transmit signal to generate a predistorted signal, the amplifier input signal generated based on the predistorted signal, and a receive channel configured to process the sampled signal to generate a processed signal, wherein the receive channel comprises a programmable filter configured to process the sampled signal on the same bandwidth as the transmit channel during a transmit period and process a receive signal on a varied bandwidth during a receive period, wherein the transmit channel is further configured to apply predistortion to a subsequent transmit signal based on the processed signal.

28. The system as set forth in claim 27, the transmit channel further operable to apply crest factor reduction to the transmit signal to generate a peak-reduced signal and operable to apply predistortion to the transmit signal to generate the predistorted signal by applying predistortion to the peak-reduced signal.

* * * * *